United States Patent [19]
Rinderle

[11] Patent Number: 4,817,198
[45] Date of Patent: Mar. 28, 1989

[54] RADIO RECEIVER

[75] Inventor: Heniz Rinderle, Heilbronn, Fed. Rep. of Germany

[73] Assignee: Telefunken Electronic GmbH, Heilbronn, Fed. Rep. of Germany

[21] Appl. No.: 807,341

[22] Filed: Dec. 9, 1985

[30] Foreign Application Priority Data

Dec. 24, 1984 [DE] Fed. Rep. of Germany ....... 3447283

[51] Int. Cl.$^4$ .......................... H04B 1/16; H04B 1/10
[52] U.S. Cl. ................................... 455/249; 455/205; 455/295
[58] Field of Search ............... 455/249, 245, 251, 296, 455/266, 247, 250, 295, 302, 205, 306, 303, 305

[56] References Cited

U.S. PATENT DOCUMENTS

| | | | |
|---|---|---|---|
| 3,622,887 | 11/1971 | Byles | 455/250 |
| 4,126,828 | 11/1978 | Kumagai . | |
| 4,172,239 | 10/1979 | Harford | 455/249 |
| 4,245,353 | 1/1981 | Bynum | 455/266 |
| 4,408,352 | 10/1983 | Dudding | 455/205 |
| 4,479,254 | 10/1984 | Craiglow | 455/247 |
| 4,561,113 | 12/1985 | Naito | 455/205 |
| 4,580,288 | 4/1986 | Rinderle | 455/247 |

FOREIGN PATENT DOCUMENTS

0168728 9/1984 Japan ..................... 455/249

*Primary Examiner*—Douglas W. Olms
*Assistant Examiner*—Curtis Kuntz
*Attorney, Agent, or Firm*—Spencer & Frank

[57] ABSTRACT

In a radio receiver in which the received signal is converted by mixing into an intermediate frequency signal and/or a baseband signal, and in which an apparatus which generates an intermediate frequency signal and/or baseband signal and derives therefrom a control signal for suppression or reduction of interfering disturbances is provided, disturbance signals in the receiver are temporarily distorted in such a way that interfering disturbances in the receiver are suppressed or reduced.

17 Claims, 12 Drawing Sheets

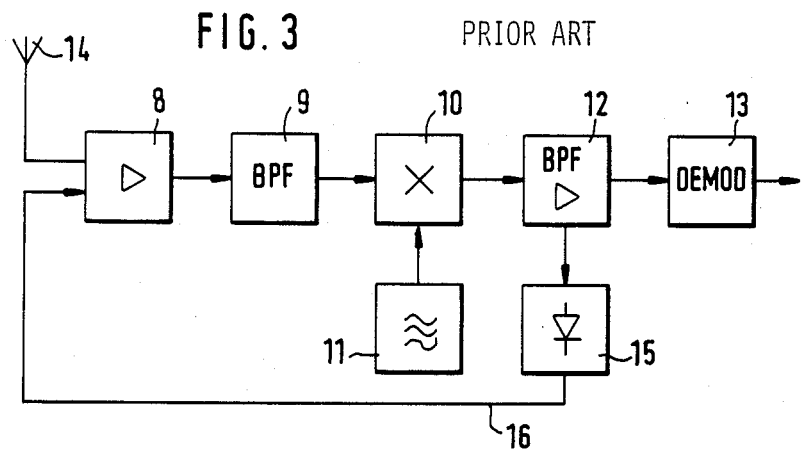
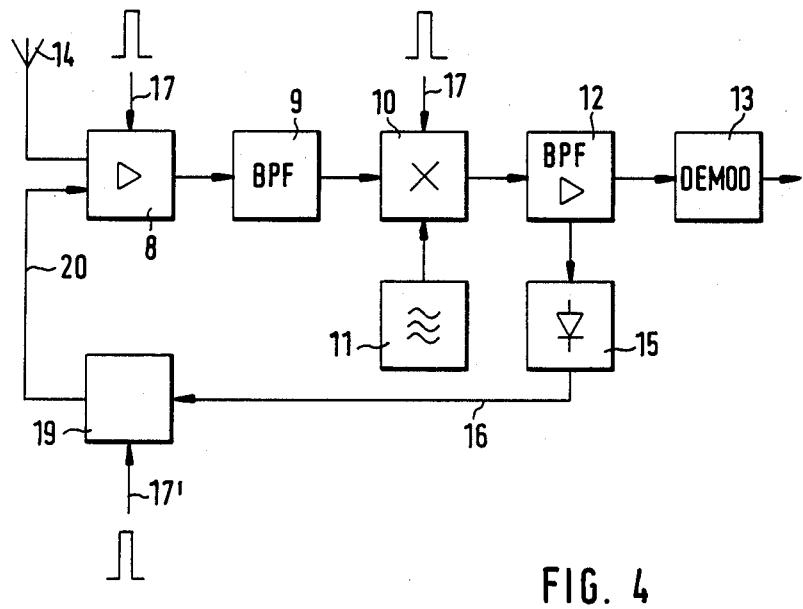
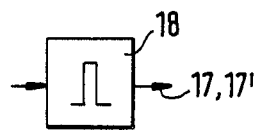

FIG. 27
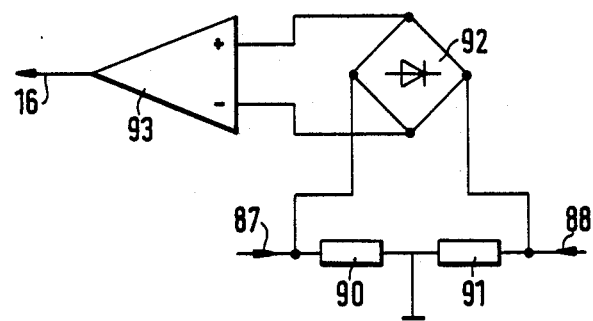
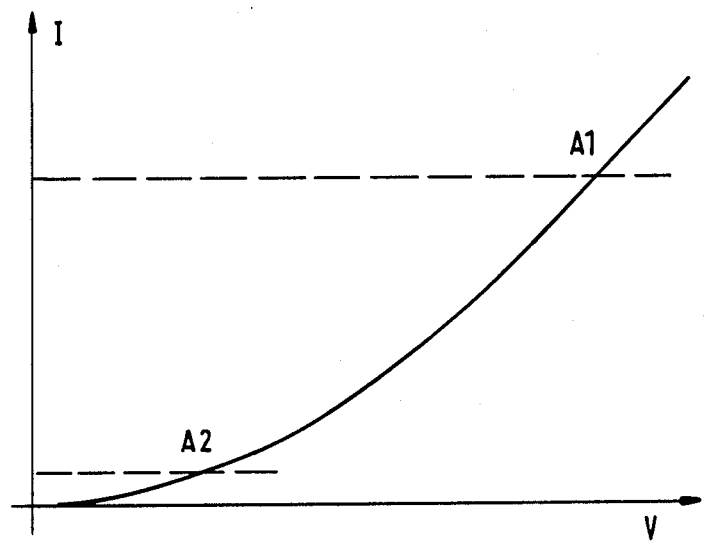
FIG. 28

RADIO RECEIVER

BACKGROUND OF THE INVENTION

The invention relates to a radio receiver in which the received signal is converted by mixing into an intermediate frequency signal and/or a baseband signal, and in which an apparatus is provided which generates an intermediate frequency signal and/or baseband signal and derives therefrom a control signal for suppression or reduction of interfering disturbances.

As is well-known, the purpose of radio receivers is to receive electromagnetic waves. Radio receivers are, for example, radio broadcast receivers, television receivers or radiotelephones.

The problem that a signal spectrum whose spectral components may exhibit level differences of up to 120 dB must be processed by the receiver is known to occur in radio receivers. The high-level signal components mostly result in interfering disturbances such as, for example, multiple reception through harmonic mixing and intermodulation. Such disturbances are known to be caused by the signal-dependent driving on the non-linear components located in the signal path.

The intermodulation disturbances are particularly critical since they may already occur at a relatively low disturbance signal level. Intermodulation disturbances are disturbances which are caused by at least two disturbance signals and constitute a disturbance when the frequencies of, for example, two disturbance signals with the frequencies $f_{s1}$ and $f_{s2}$, respectively, have such a constellation in relation to each other that one of the two conditions $$2f_{s1}-f_{s2}=f_e \text{ or } 2f_{s2}-f_{s1}=f_e$$

is met, with $f_e$ the frequency of the desired signal or the adjusted receiving frequency.

In this case, an "apparent" desired signal which—in the case of two disturbance signals—typically contains the modulation content of both disturbance signals, may be received on the desired frequency. Such a reception situation is then mostly interpreted by the user, for example, the radio broadcast listener, as lacking selectivity of the receiver. Another disturbing effect of the intermodulation is the interference formation with a weaker desired signal, which could be satisfactorily received, for example, without intermodulation or at low intermodulation. The danger of the disturbing effect of high-level signal components at the receiver input generally increases overproportionally with the number of high-level signal components and with their level. In most cases, intermodulation disturbances in a radio receiver are formed in the receiver stages before the channel selection, i.e., in the receiver prestage (RF) or in the mixing stage. Components which cause such disturbances are, for example, bipolar transistors, field-effect transistors and diodes; varactor diodes are also included in the intermodulation forming components.

In technical literature, the intermodulation behavior of a radio receiver is characterized by the so-called intercept point. It is the third order intercept point that is meant. The intercept point is apparent from the diagram of FIG. 1. Indicated in this diagram, on the abscissa axis are the level of the desired signal $P_e$ and also the levels $P_{s1}$ and $P_{s2}$ of the two disturbance signals causing the intermodulation, and on the ordinate axis, as an example, the intermediate frequency signal level $P_{if}$ at the output of the receiver mixing stage. Curve 1 shows the output signal level $P_{if}$ in dependence upon the desired signal $P_e$. Curve 2 describes the dependency of the output level $P_{if}$ on disturbance signal levels $P_{s1}$ and $P_{s2}$, which causes the intermodulation (3rd order). In the illustration of the dependency, it is assumed that both axes of FIG. 1 have logarithmic graduation, that the two disturbance signal levels are, furthermore, identical and that there is also no amplification control in the signal path. It is, furthermore, assumed that the level at which a signal/disturbance ratio of 30 dB occurs at the receiver output, in relation to a predetermined desired signal modulation, is regarded as the smallest desired signal level in the diagram (zero point of the abscissa axis). The point of interception of the two curve tangents produces a fictitious point in the diagram, the so-called intercept point, which is associated with a certain input level, the fictitious level of the disturbance signals forming the intermodulation and a certain fictitious IF output level. The gradients of the two curve tangents typically differ by the factor 3. In radio receivers, the intercept point is generally indicated in relation to the receiver input level (IP3).

A large level value of the intercept point is aimed at for a radio receiver. The larger this value, the larger are the disturbance signal levels which the receiver can process without a disturbing effect through intermodulation. An increase in the intercept level of a receiver is, however, limited by economic considerations.

In order to reduce intermodulation disturbances or, more generally, interfering disturbances, it is known to control the amplification at the receiver input in dependence upon the input signal, for example, by controlling an amplification component or by controlling a damping member comprised, for example, of PIN diodes. In known radio receivers, the control signal controlling the amplification or damping is produced, for example, by rectification of the amplified intermediate frequency signal and/or by rectification of the signal before the channel selection, for example, via the output of the prestage or via the input or the output of the mixing stage.

The positive effect of such a control for decreasing interfering disturbances does, however, only occur when the component controlling the amplification or the damping is arranged before the receiver stage forming the interference, and the controlled component itself does not contribute towards the interference.

The disadvantage of the known radio receiver circuit, wherein the control signal is produced by rectification of the IF signal in the signal path of the receiving section, is that complete suppression of the demodulation of an interference signal is, in principle, not possible since the control signal required to suppress the interference cannot be produced in the control circuit by the interference signal itself. If an interference signal already produces an effective control signal, the interference signal is also demodulated and, therefore, causes a disturbance. In this case, the interfering disturbance can only be suppressed by a correspondingly strong desired signal.

In a radio receiver of the described kind, the disturbance likelihood through interference may only be reduced by reducing the threshold level for signal gain/damping control.

This measure does, however, have the disadvantage that the maximum signal/noise ratio of a received desired signal that is attainable remains correspondingly low since for a desired signal, above the threshold level, the signal/noise ratio practically no longer increases with the desired signal level.

The disadvantage of the known radio receiver circuit, wherein the control signal is produced in broadband configuration by rectification of the signal before the IF selection, is that with the presence of high-level signals which are not desired signals and which produce correspondingly control signals, the entire signal composition, also the desired signals at the receiver input, are attenuated, and, more particularly, also when no disturbance would occur on account of the frequency constellation of the disturbance signals. Even one single strong disturbance signal which does not form an intermodulation product, impairs or thus stops reception of weaker desired signals.

SUMMARY OF THE INVENTION

The object of the invention is to provide a radio receiver, in particular, a radio broadcast receiver, which is capable of at least substantially suppressing interfering disturbances, in particular, through intermodulation, and which, in contrast to known receivers, is nevertheless still able to receive relatively weak signals.

In a radio receiver, in accordance with the invention, in which the received signal is converted by mixing into an intermediate frequency signal and/or a baseband signal, and in which an apparatus which generates an intermediate frequency signal and/or baseband signal and derives therefrom a control signal for suppression or reduction of interfering disturbances is provided, disturbance signals in the receiver are temporarily distorted in such a way that interfering disturbances in the receiver are suppressed or reduced.

A distortion is synonymous with an increase in the non-linearity of the characteristic of components in the signal path of the receiver. The temporary distortion which is caused deliberately (as is known, a certain distortion is unavoidable) and which at the times during which the distortions are effected, means an increase in the distortion, is preferably produced by a pulse signal. Although the pulse signal always effects a corresponding non-linearity of characteristics of one or several components during the pulse duration, a signal distortion does, however, only occur when the level of the disturbance signal(s) exhibits larger values.

In the receiver according to the invention, it is a question of only those control signal values delivered by the signal rectifier of the receiver being fed to the preamplifier of the receiver which are present during the times at which the inventive distortions are effected. The control signal values occurring between the distortions at the output of the signal rectifier should, on the other hand, not be passed on to the preamplifier. In order to achieve this, it is necessary to store the control signal values occurring during the distortions until the occurrence of the respective next distortion and to pass on the thus stored values to the preamplifier. A so-called sample and hold circuit which is controlled by a pulse signal whose pulses only occur when pulses of the pulse signal effecting the inventive distortions also occur, is, for example, suitable for this task.

The sample signal may, therefore, not be present when the pulse signal effecting the distortions is not present. The width of the sample pulses may be smaller than the width of the pulses of the pulse signal effecting the distortions. The simplest solution consists in both pulse signals being generated by the same pulse generator.

The temporary signal distortion (distortion increase) in accordance with the invention, takes place in the receiver in the signal path between the input and the output of the mixer. This signal distortion takes place, for example, in the mixer and/or preamplifier of the receiver, and, more particularly, for example, by correspondingly low negative signal feedback (which is lower than the usual negative signal feedback) and/or by corresponding operating point setting of components in the preamplifier and/or mixer.

It is also possible to connect distortion forming components to the preamplifier and/or mixer in order to obtain the desired distortion. The connected components are designed to effect the desired distortion. This is, however, also applicable to components of the mixer and/or components of the preamplifier.

The control signal produced in accordance with the invention and fed to the input stage of the receiver is used for signal attenuation in the signal path of the receiver. For this purpose, a controllable component located in the signal path of the receiver is, for example, controlled by the control signal. The control signal may, for example, also serve to increase the preselection of the receiver. An increase in the preselection of the receiver is, for example, effected by changing the signal transformation between signal source (antenna) and selection means.

The radio receiver according to the invention effects not only a reduction in the intermodulation disturbances, but is also capable of suppressing disturbances occurring through harmonic mixing, as is the case, for example, in the presence of high-level disturbance signals whose frequency is higher than the receiving frequency by half the intermediate frequency or two-thirds of the intermediate frequency.

A deliberate distortion of a signal which is synonymous with a reduction in the intercept level of the circuit causing the distortion is effected by deliberately produced higher non-linearities of components or by connecting additional components thereto. Particularly strong non-linearities are, for example, attained in a transistor by there being no or only slight negative feedback. An increased non-linearity of a receiver stage may, for example, be effected in a simple manner by alteration of the operating point of the active amplifier component of the stage.

When desired signals are received, in an apparatus according to the invention, the actuating variable only becomes effective at desired signal levels already indicating an adequate signal/noise ratio, whereas with the occurrence of interference signals, in particular, intermodulation products, the control signal already becomes effective at such disturbance levels that the receiving path is not disturbed or only to a slight extent. Also, the control signal only becomes effective when the frequency constellation of the disturbance signals would cause a disturbance of the desired signal.

BRIEF DESCRIPTION OF THE DRAWINGS

The invention will now be described in greater detail, by way of examples, with reference to the drawings, in which

FIG. 3 shows the signal processing section of a known radio receiver;

FIG. 4 shows an embodiment of a receiver according to the invention;

FIG. 27 shows an example of a coupling circuit;

FIG. 28 shows the transfer function in the signal path of a receiver.

DESCRIPTION OF THE PREFERRED EMBODIMENTS

Figure 1:
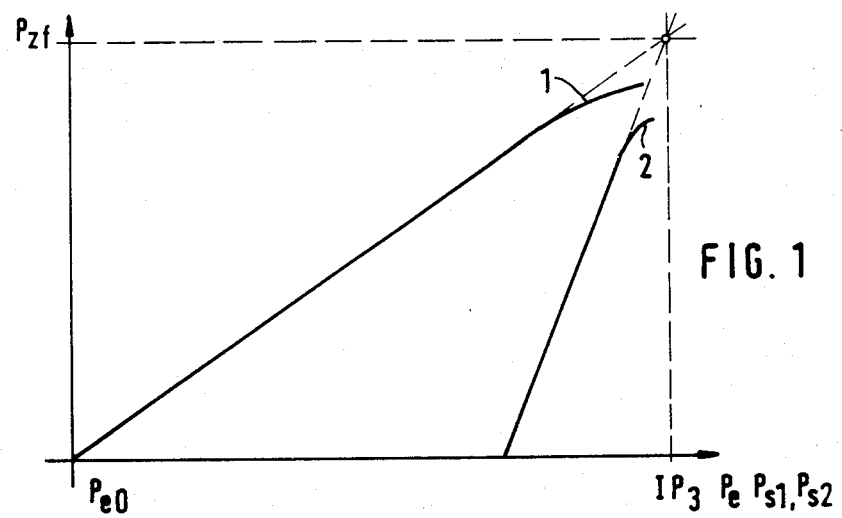
FIG. 1 shows the behavior between desired signal and interference signal(s)
Figure 2:
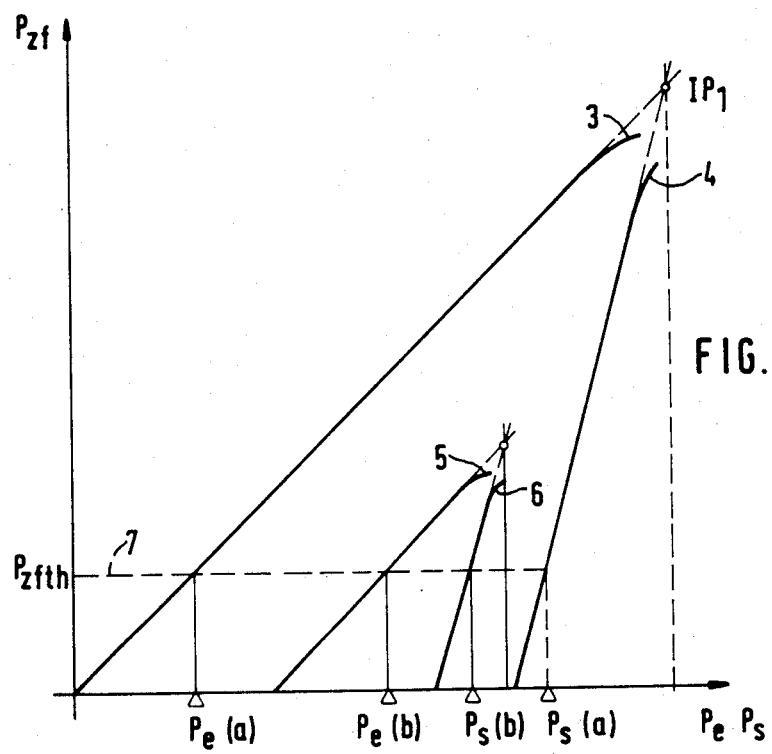
FIG. 2 shows the behavior of a receiver with respect to the desired signal, the intermodulation forming disturbance signal levels and also the threshold levels of the control signals.

FIG. 2 shows the behavior of a receiver with respect to the desired signal level, the intermodulation forming disturbance signal levels and also the threshold levels of the control signal. The curves of FIG. 2 show the dependency of the IF level $P_{if}$ on the desired signal level $P_e$ and also on the disturbance signal levels $P_s$ in double logarithmic representation. The curve 3 shows the dependency of the IF level on the desired signal level $P_e$ of the receiver. The curve 4 shows the dependency of the IF level caused by intermodulation of the disturbance signal levels $P_s$. The points of intersection of the curves 3 and 4 form the intercept point $IP_1$ of the receiver.

With the start of the control signal (threshold level) according to the invention, the receiver has, in accordance with the point of intersection of the tangents of the curves 5 and 6, temporarily a lower intercept point $IP_2$. In the illustration of FIG. 2, $P_{ifth}$ is the IF level at which the control signal becomes effective. The point of intersection of the dashed line 7 with the line 5 produces the desired signal level $P_e$ (b), at which the control variable becomes effective. The point of intersection of the line 7 with the curve 6 produces the level $P_s(b)$ of the disturbance signal at which the control signal becomes effective. If the control signal were produced as in known radio receiver circuits one would obtain, for example, the corresponding threshold levels of the control for the desired signal at $P_e(a)$ and for the disturbance signal level at $P_s(a)$.

With the inventive generation of the control signal, it is effected that the control of the amplification or damping or preselection of the receiver at low disturbance signal levels and, on the other hand, only at high desired signal levels, is attained. A high-level disturbance signal or disturbance signal pairs whose interference products do not fall into the receiving channel, do, however, not produce a control signal. In this way, disturbing intermodulation products are, on the one hand, effectively decreased, and, on the other hand, the reception of weak signals is not impaired by "non-disturbing" high-level signals which are not desired signals.

The effect of application of increased threshold levels for the desired signals is that the attainable signal/noise ratio at the output of the receiver can exhibit an adequate value. The inventive circuit enables, by corresponding selection of the non-linearity required to obtain the distortion and thus by corresponding selection of the intercept point of the apparatus producing the control signal, setting of the threshold levels application point of the control before the intermodulation disturbance is perceived by the receiver and this suppression is maintained in a larger level area of the disturbance signals.

FIG. 3 shows the signal section of a known radio receiver which, in accordance with FIG. 3, comprises a preamplifier 8, a band-pass filter 9, a mixer 10, a local oscillator 11, a selective amplifier 12 (intermediate frequency amplifier) and a demodulator 13. The band-pass filter 9 is generally of tunable design. The input signal is fed from the antenna 14 to the input of the prestage 8 of the receiver, preselected in the band-pass filter 9 and converted in the mixing stage 10 with the aid of the local oscillator 11 into an intermediate frequency signal. The intermediate frequency signal is amplified in the selective amplifier 12 and demodulated in the demodulator 13. A signal rectifier 15 produces from the intermediate frequency signal the control signal 16 which serves, for example, to control an actuating member for signal attenuation in the prestage 8 of the receiver.

FIG. 4 shows an inventive receiver which differs from the known receiver of FIG. 3 in that, in accordance with the invention, the signal is distorted to a stronger degree in the signal path, and, more particularly, with the aid of a pulse signal 17. The inventive distortion is effected by the pulse signal 17, for example, correspondingly displacing the operating point of the prestage amplifier transistor and/or the operating point of the mixer and/or switching a component causing a distortion during the pulse duration into the signal path. The pulse signal is generated, for example, by a pulse generator which is designated in FIG. 4 by the reference numeral 18.

The pulse generator 18 preferably generates a pulse sequence. The pulse width of the pulses corresponds to the time during which the inventive distortion takes place. The pulse duty factor, i.e., the ratio of the pulse duration to the time which lapses between the pulses is preferably selected small (for example, smaller than 5%).

The inventive radio receiver of FIG. 4 comprises, in addition to the preamplifier 8, the band-pass filter 9, the mixer 10, the local oscillator 11, the selective amplifier 12, the demodulator 13, the signal rectifier 15 and the pulse generator 18 which has just been described, a circuit component 19 whose task it is to feed the prestage a control signal 20 during the inventive distortion (pulse duration). The control signal 20 is derived from the control signal 16 taken from the signal rectifier 15. The control signal 20 corresponds to the values of the control signal 16 which are present during the distortions (pulse duration).

Since a control signal only occurs at the output of the circuit component 19 during the distortion (pulse duration), the output signal of the circuit component 19 would without any additional measure be a pulse signal which corresponds to the pulse signal 17 causing the distortion with respect to the time sequence. Such a pulse signal would, however, be an unsuitable control signal for controlling the signal attenuation. A sample and hold circuit which is controlled by the sample pulse 17 is, therefore, necessary. The sample pulse signal 17' is preferably identical with the pulse signal 17 which effects the inventive distortion or has at least the same pulse sequence as the signal 17 with respect to time. The effect of the sample and hold circuit is that the control signal present during the distortion is ascertained and held until commencement of the next sample pulse 17'. When a new sample pulse 17' comes, the then predominating control signal is ascertained and likewise held (stored) again until a new sample pulse occurs.

If the control signal 16 taken from the signal rectifier 15 is represented in dependence upon the time, a distinction must then be made between several cases which will be explained in the following. As already indicated, an antenna signal contains, in addition to the desired signal component, disturbance signal components which do, however, only become effective as interference disturbances with certain frequency constallations, more particularly, when, on account of a certain frequency constellation, they fall into the desired channel.

Figure 5:
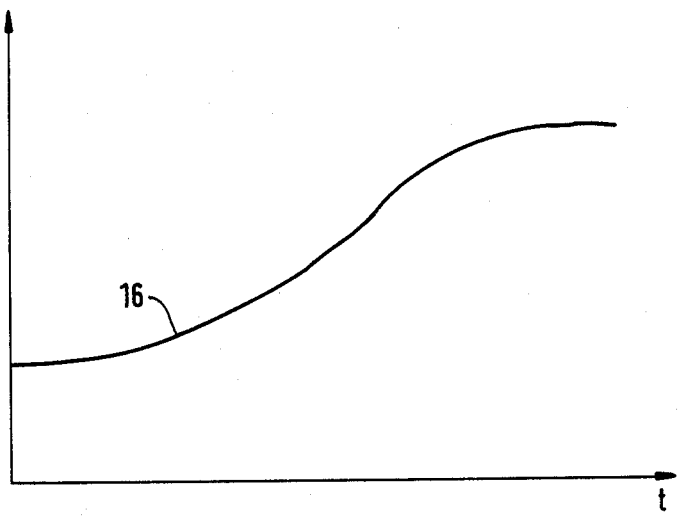
FIG. 5 shows a time dependent rectified received signal.

In the first case, a desired signal should be present, but not an interfering disturbance (because the interfering disturbance components do not fall into the desired channel). Also, the inventive distortion should not be carried out so that the conditions of a known receiver prevail. FIG. 5 shows for this case the control signal path in dependence upon the time. The curve of FIG. 5 represents a rectified signal which is gained by rectification of a received signal whose amplitude is time-variant.

Figure 6:
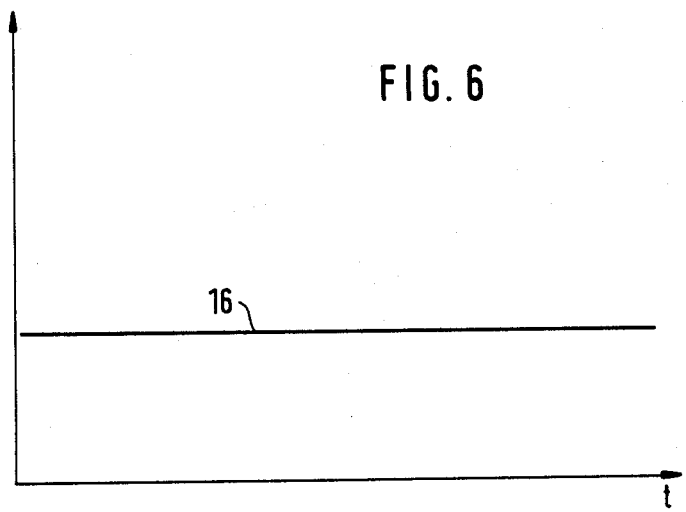
FIG. 6 shows the case where an interfering disturbance, but no desired signal is present.

FIG. 6 shows the case where an interfering disturbance is present, but no desired signal. Also, it should again be a known receiver in which no inventive distortion takes place. In the case of FIG. 6, the disturbance is assumed to be constant so that the control signal path is also constant.

Figure 7:
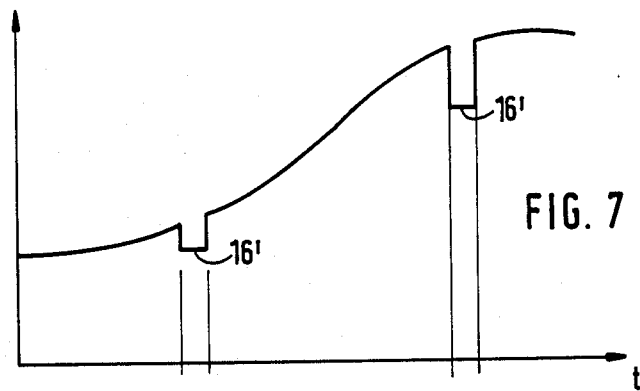
FIG. 7 show the case where a desired signal, but no interfering disturbance is present.

FIG. 7 shows the case where a desired signal, but no interfering disturbance is present, and the inventive temporary distortion (in the presence of strong disturbance signals) takes place, which results in a distortion increase since a certain degree of distortion is also always present without deliberate distortion and is, therefore, unavoidable. According to FIG. 7, in the aforementioned case (desired signal, no interfering disturbance, but inventive distortion), there is during the inventive distortion effect (pulse duration) a control signal reduction 16' which in the same case in the known receiver according to FIG. 5 (without the inventive distortion) is not present. The control signal reduction 16' present in FIG. 7 is due to the fact that there is a decrease in the amplification (for example, by operating point alteration) during the pulse duration.

Figure 8:
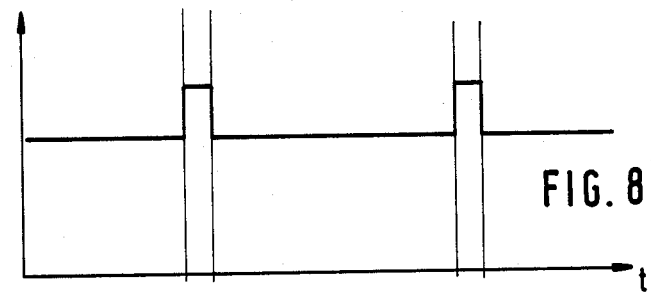
FIG. 8 shows the case where solely an interfering disturbance (without desired signal) is present and the inventive distortion takes place.

FIG. 8 shows the case where solely an interfering disturbance (without a desired signal) is present, and the inventive distortion takes place. According to FIG. 8, there is an increase in the control signal during the inventive distortion, which is due to the fact that during the pulse duration the distortion is increased in accordance with the invention, and the interference component in the desired channel, therefore, increases in accordance with the degree of distortion. An increase in the interference component in the desired channel is, however, synonymous with an increase in the control signal so that the control signal in the example of FIG. 8 (interfering disturbance without desired signal with inventive distortion) increases during the pulse duration.

Figure 9:
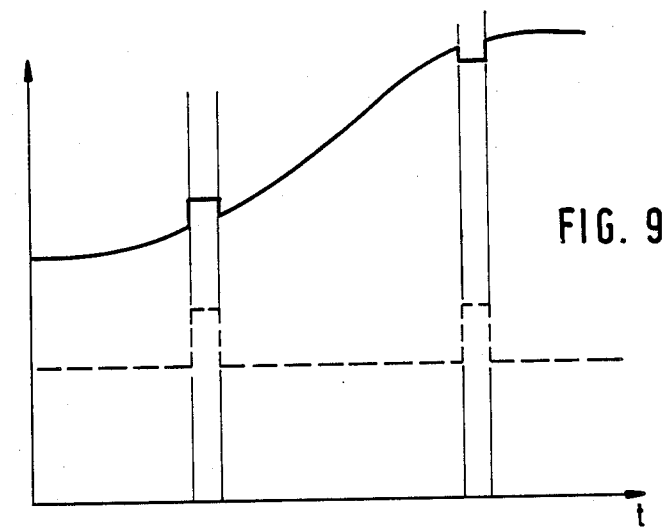
FIG. 9 shows the case where, in addition to a desired signal, an interference component is present, and the inventive distortion takes place.

FIG. 9 shows the case where in addition to a desired signal, an interference component (in the desired channel) is present, and where the inventive distortion also takes place. In this case, the curves of FIG. 7 and 8 are superimposed, with the result that in the control signal path of FIG. 9, the control signal increases during the first pulse and decreases during the second pulse. In the example of FIG. 9, the control signal during the duration of the first pulse is determined by the level of the interfering disturbance, whereas the control signal during the duration of the second pulse is determined by the level of the desired signal.

Figure 10:
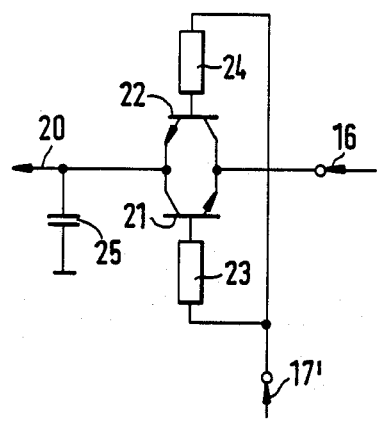
FIG. 10 shows a sample and hold circuit.
Figure 11:
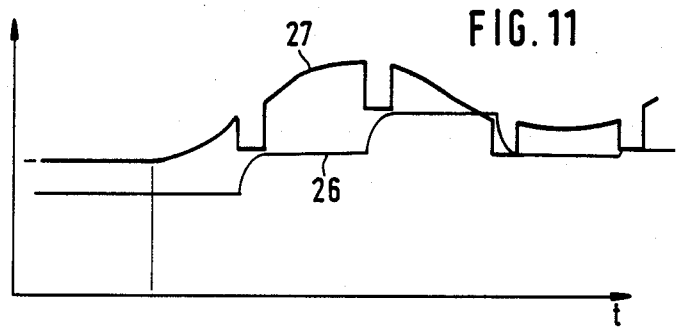
FIG. 11 shows a time dependent control signal.

FIG. 10 shows an embodiment for the circuit section 19 of FIG. 4. The circuit section 19 of FIG. 4 consists of a transistor circuit with the transistors 21 and 22 which are made conductive via the resistors 23 and 24 by the sample signal 17'. During the duration of the sample pulse 17', the storage capacitor 25 is charged to the value of the control signal 16'. The variable stored in the capacitor 25 is maintained, as described above, until the next sample pulse occurs. The capacitor 25 is then recharged to the now prevailing control signal value 16'. The capacitor 25 supplies the control signal 20 for the receiver. It may be advantageous for the storage capacitor 25 to be charged to a means value of the control signal 16' which occur during the distortion and originate from several pulses. The control signal 20 has, for example, the path 26 drawn out in FIG. 11. The curve 27 shows for the same case (desired signal without interfering disturbance) the path of the control signal 16.

Figure 12:
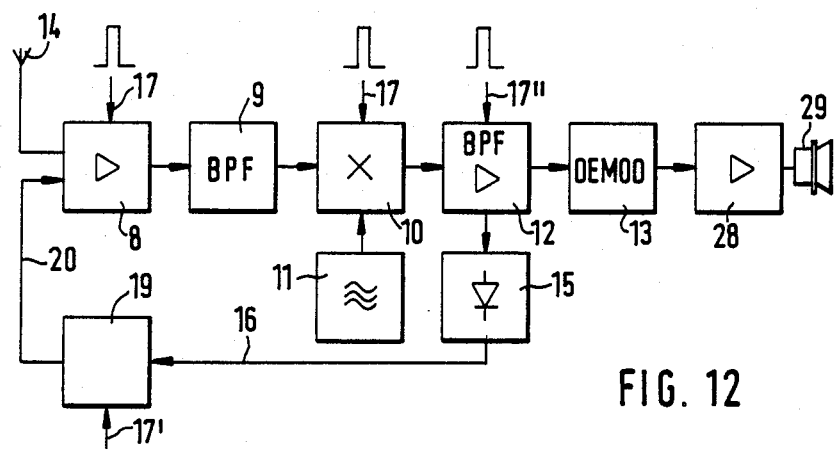
FIG. 12 shows a further embodiment of receiver circuit according to the invention.

FIG. 12 shows a further development of the receiver circuit of FIG. 4, wherein the pulse 17" is fed to the selective amplifier 12: the task of this pulse 17" is to compensate the amplification change caused by the pulses 17 in the presence of desired signals. The amplification change (opposite) required therefore may be effected by the height of the pulse or by, for example, the degree of negative feedback being switched over within the selective amplifier by means of the pulse. FIG. 12, furthermore, shows the audio frequency amplifier 28 and a loudspeaker 29 following the demodulator in a receiver.

Figure 13:
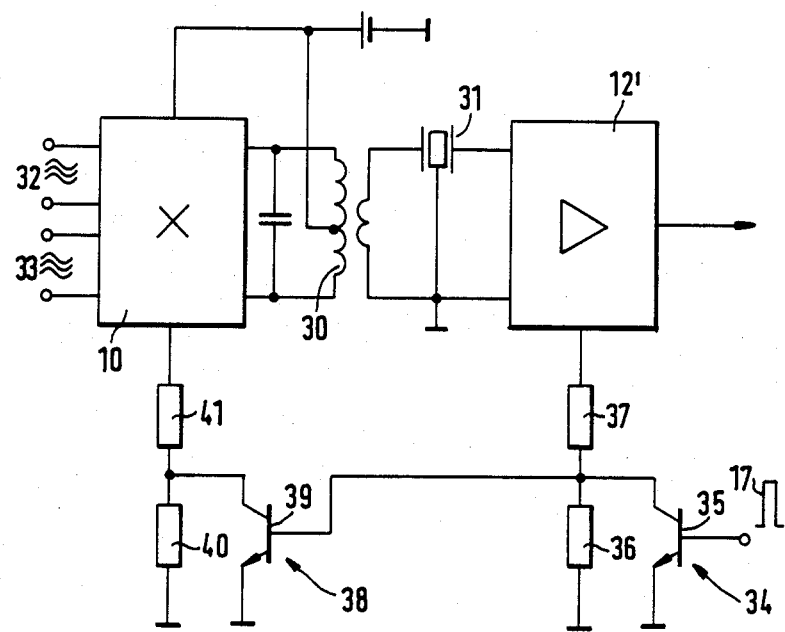
FIG. 13 shows a modification to provide an amplification compensation.

FIG. 13 shows an embodiment for the described amplification compensation. Of the actual receiver, only the mixer 10, a band-pass filter consisting of the oscillating circuit 30 and the ceramic filter 31, and the amplifier 12' are illustrated in FIG. 13. The mixer 10 is driven by the input signal 32 and by the local oscillator signal 33. For the amplification compensation, a pulse 17 is fed to a circuit section 34 consisting of the transistor 35 and the resistors 36 and 37. The task of the transistor 35 is to short circuit the resistor 36 during the pulse duration and thus increase the current for the amplifier stage 12'. The inverted pulse 17 simultaneously reaches the circuit section 38 consisting of the transistor 39 and the resistors 40 and 41. In the circuit section 38, the transistor 39 is kept open at the time during which the transistor 35 of the circuit section 34 is closed. The current in the mixing stage 10 is thereby reduced in the same period of time because the sum of the resistances 40 and 41 becomes effective as resistance during this period of time.

Figure 14:
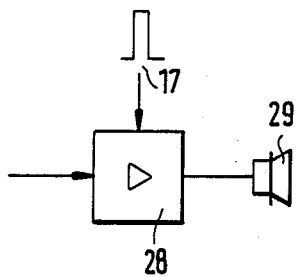
FIG. 14 shows an example wherein the audio frequency amplifier is fed by a pulse for suppression of disturbances.

FIG. 14 shows an embodiment wherein a pulse 17 is fed to the audio frequency amplifier 28 to suppress disturbances occurring during the pulse time. This is effected by the amplification of the low frequency amplifier 28 being reduced during the pulse duration.

Figure 15:
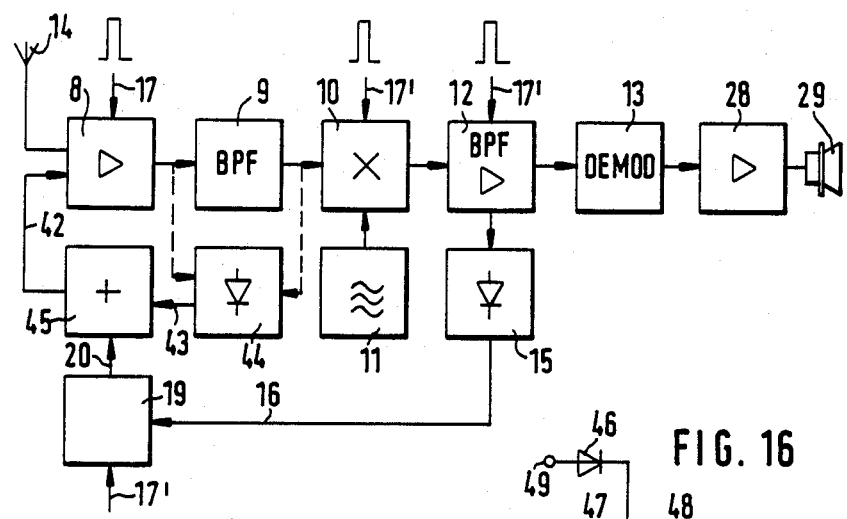
FIG. 15 shows an example of a receiver according to the invention, wherein the input stage of the receiver is fed by a combined control signal.

FIG. 15 shows an embodiment of the invention wherein the input stage 8 of the receiver is fed by control signal 42 composed of the signal 20 generated by the circuit component 19 and a signal 43 generated by rectification of a signal which is taken from the output of the prestage 8 or from the output of the band-pass filter 9. The rectification is effected with the aid of the rectifier circuit 44. Both signals are added in the adder 45 and produce the control signal 42. The task of the signal 43 is to avoid an overloading of the input stage and/or mixing stage of the receiver when the signal generated by the circuit component 19 is not effective.

Figure 16:
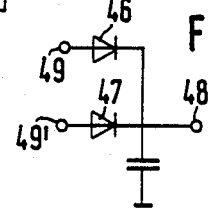
FIG. 16 shows an adding circuit.

FIG. 16 shows the configuration of an adding circuit 45. It comprises two diodes 46 and 47 which are connected to the output 48. The terminals 49 and 49' are fed by the signals 20 and 43. In the circuit of FIG. 16, the strongest input signal determines the control signal at the output 48.

Figure 17:
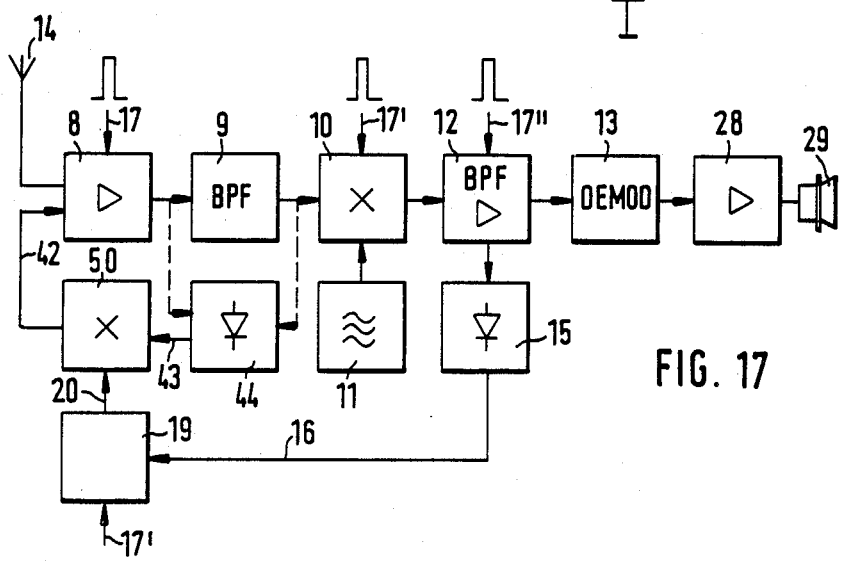
FIG. 17 shows a modification of the receiver circuit of FIG. 15 wherein instead of an adder, a multiplier is provided.

In the embodiment of FIG. 17, the two signals are not fed to an adder but to a multiplier 50. Instead of a multiplier, an AND circuit may also be provided.

Figure 18:
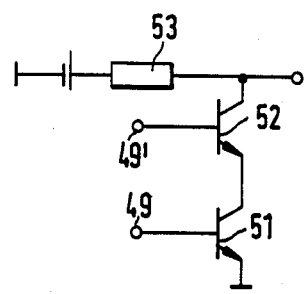
FIG. 18 shows a multiplier and AND circuit, respectively.

FIG. 18 shows an example of a multiplier and AND circuit, respectively. The circuit of FIG. 18 consists of the series connected transistors 51 and 52 and also the output resistor 53. In the present case, a multiplier or AND circuit has the advantage that the control signal resulting from the two signals does not occur until the second signal preferably occurs only with relatively strong input signals (from the antenna). As a result, the signal generated in the apparatus only becomes effective with relatively strong desired signals.

Figure 19:
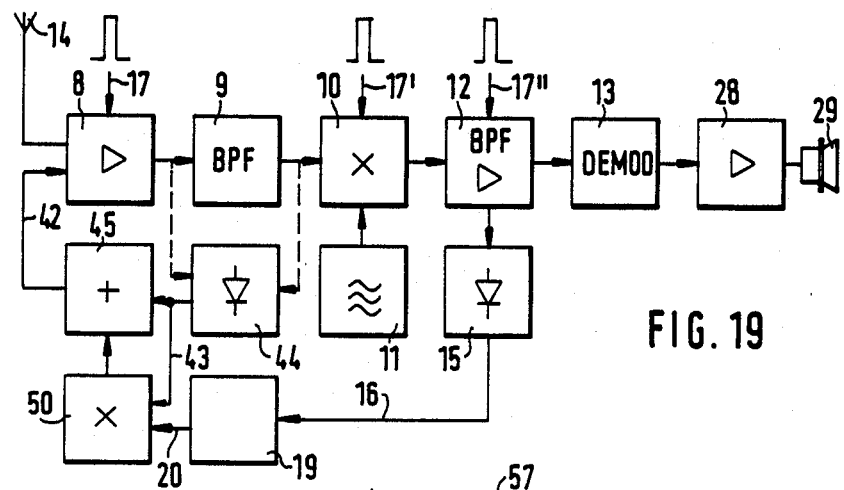
FIG. 19 shows of an embodiment of a receiver circuit according to the invention the combination of a multiplier with an adder.

In the arrangement of FIG. 19, the combination of a multiplier 50 with an adder 45 is provided as coupling circuit. Such a combination has the advantage that, on the one hand, an overloading of the prestage and/or the mixing stage of the receiver is prevented, and, on the other hand, the signal 20 only become effective with relatively strong desired signals.

Figure 20:
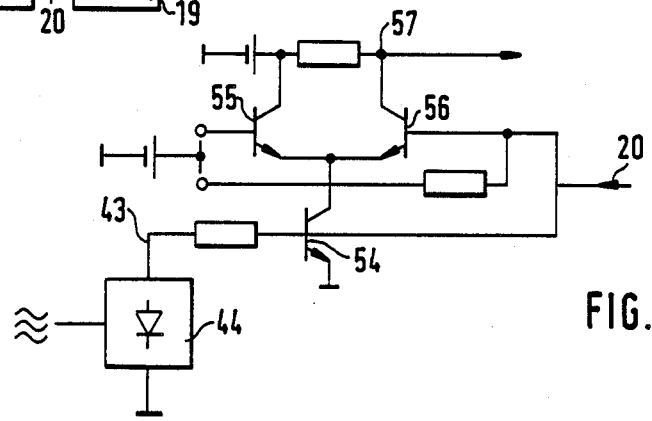
FIG. 20 shows a coupling circuit.

FIG. 20 shows an embodiment for the coupling circuit 50 of FIG. 19 and also for the rectifier circuit 44 of FIG. 15. The circuit of FIG. 20 comprises the transistors 54, 55 and 56. The second signal 43 is fed to the base of the transistor 54, while the output signal 20 of the circuit component 19 is fed to the bases of the transistors 54 and 56. The resulting control signal is taken from the circuit point 57.

Figure 21:
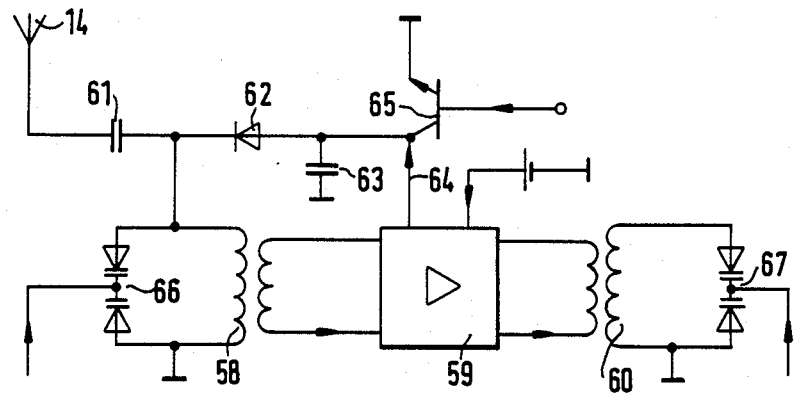
FIG. 21 shows a tuned receiver prestage with signal damping by a PIN diode.

FIG. 21 shows an embodiment of a receiver prestage with a controllable signal attenuation. The prestage of FIG. 21 comprises a tunable preselection circuit 58, an active amplifier 59 and a tunable output circuit 60. The antenna 14 is transformatically coupled via the capacitor 61 to the preselection circuit 58. The signal attenuation is carried out by a PIN diode 62 which as controllable alternating-current resistor is connected in parallel via the capacitor 63 to the preselection circuit 58. The current serving to control the PIN diode is derived from the operating current 64 of the stage 59. The transistor 65 which acts as controllable shunt resistor and is controlled by a control signal derived from the control signal 20 and 42, respectively, serves to control the current fed to the PIN diode 62. The tuning of the tuned circuits 58 and 60 is carried out by varactor diodes 66 and 67.

The circuit of FIG. 21 has the advantage that the entire receiver circuit is protected against disturbing interferences by the signal attenuation at the preselection circuit 58. Use of the PIN diode is advantageous because it itself does not cause any distortions at higher frequencies. The circuit of FIG. 21 is particularly well suited for FM radio broadcast receivers.

Figure 22:
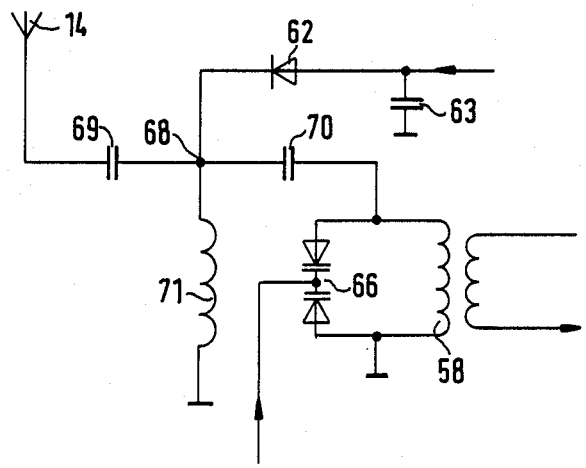
FIG. 22 shows a signal damping circuit.

The circuit of FIG. 22 differs from the arrangement of FIG. 21 in that the PIN diode 62 acts on the circuit point 68. The transformation of the antenna resistance to the preselection circuit 58 is carried out via the circuit point 68. By means of the controllable PIN diode 62 the signal attenuation is controlled in such a way that the selectivity between antenna 14 and amplifier 59 increases with an increase in the signal attenuation. With the control of the signal attenuation, the transformation of the antenna resistance to the preselection circuit 58 is simultaneously controlled in such a way that the extended selectivity increases with an increase in thte signal attenuation.

The network provided for the transformation of the antenna resistance to the selection circuit 58 comprises the capacitors 69 and 70 and also the coil 71. The network has the characteristic that—in relation to the circuit point 68—the highest impedance occurs within the receiving band and that this impedance is substantially larger than the antenna resistance.

Figure 23:
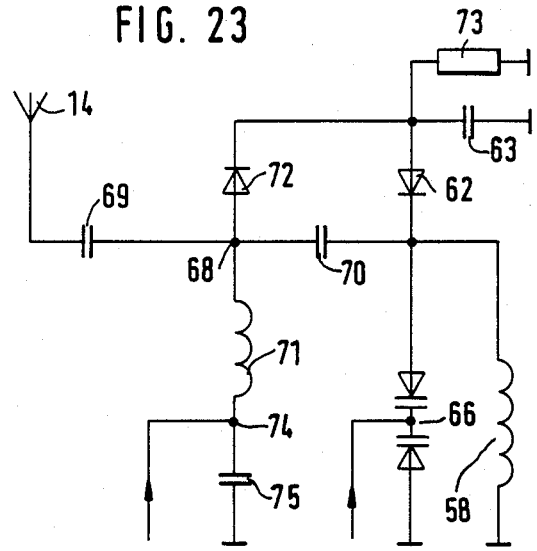
FIG. 23 shows an extended signal damping circuit at the input of the receiver prestage.

FIG. 23 shows an embodiment of the signal damping at the input of the receiver prestage wherein a second PIN diode 72 is provided. The effect produced by the two PIN diodes is that the circuit of FIG. 23 exhibits a combination of the characteristics of the arrangements of FIGS. 21 and 22. The effect of the additional resistor 73 is that the signal damping is carried out by the PIN diode 62 at a higher level than the signal damping by the PIN diode 72. The control signal is fed to the connection point 74. The connection point 74 is grounded for the signal frequency by the capacitor 75.

Figure 24:
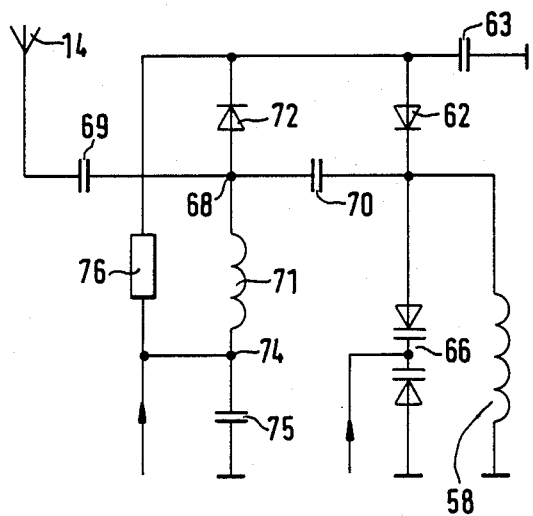
FIG. 24 likewise shows a signal damping at the input of the receiver prestage.

The circuit of FIG. 24 differs from the circuit of FIG. 23 in that the resistor 73 of the circuit of FIG. 23 is missing in it and instead of it the resistor 76 is provided between one end of the coil 71 and the cathode of the PIN diode 72. A reversal of the conditions is thereby attained, i.e., the signal damping by the PIN diode 72 starts at a higher level than the signal damping by the PIN diode 62.

Figure 25:
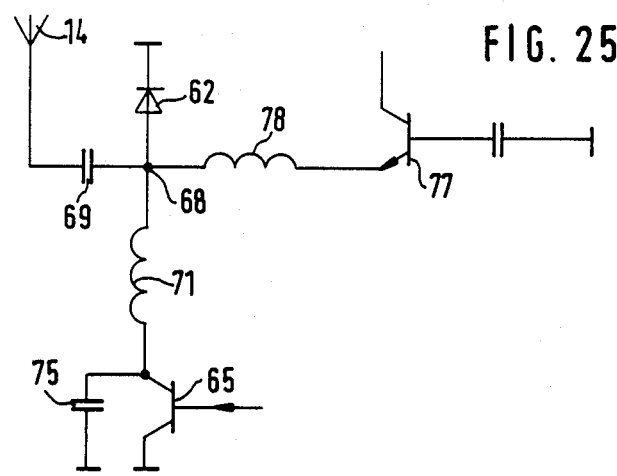
FIG. 25 shows the input circuit of a receiver prestage with broad bond width input.

FIG. 25 shows the input circuit of a receiver prestage wherein a transistor 72 in common-base circuit is provided as amplifier transistor. The antenna 14 is coupled via a network to the emitter of the transistor 77. The network consists of the capacitor 69, the coil 71 and the coil 78. The network is so dimensioned that the largest impedance occurs at the midband frequency of the receiving band—in relation to the circuit point 68. The PIN diode 62 is arranged between the circuit point 68 and the reference point. The controlling of the PIN diode is carried out via the shunt transistor 65 by means of the signal which is derived from the control signal 20 and 42, respectively. The circuit of FIG. 25 does not require a tunable input circuit.

Figure 26:
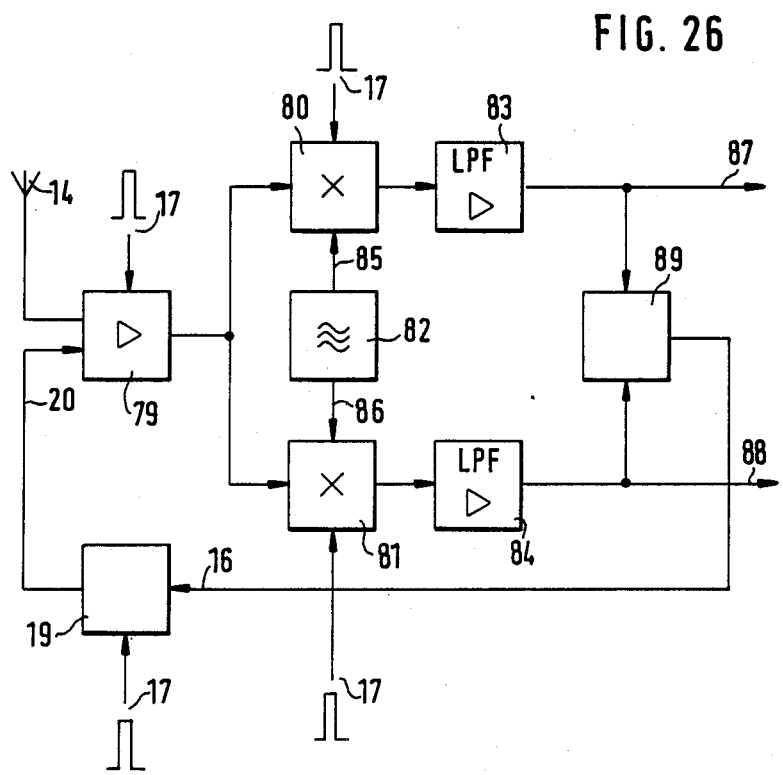
FIG. 26 shows an example, wherein the receiver input signal is converted into a baseband signal.

FIG. 26 shows an embodiment of the invention wherein the input signal of the receiver is not converted into an intermediate frequency signal, but directly into a baseband signal. The receiving section consists of the input amplifier 79, the mixers 80 and 81, the oscillator component 82 and the active low-pass filters 83 and 84. The input amplifier 79 is preferably in the form of a tunable selective amplifier. The oscillator component 82 produces two signals 85 and 86 offset with respect to each other by 90°, which are fed to the mixers 80 and 81. In the case of a synchronous demodulation of the input signal, it is necessary to return the signal formed at the output of the amplifier 83 to the oscillator component 82 to control the frequency. The mixer 81, the active low-pass filter 83 and the controllable oscillator component 82 form a phase-control loop. It controls the synchronous demodulation of the receiving section. At the output of the active low-pass filter 83 there is thereby formed a low frequency signal 87 corresponding to the frequency modulation of the signal, while a signal quantity 88 corresponding to the amplitude of the signal is formed at the output of the active low-pass filter 84. The amplified output signal is fed to the mixers 80 and 81.

The inventive signal distortion takes place in the signal path from the input to the output of the mixers 80 and 81. To obtain the control signal 24, the output signals 87 and 88 are coupled in the coupling circuit 89 and the output signal 16 and 16', respectively, of the coupling circuit 89 is converted in the circuit component 19 into the actuating variable 20.

FIG. 27 shows an embodiment for the coupling circuit 89. The coupling circuit consists in the simplest form of an adding circuit with the resistors 90 and 91. The composite signal formed from the signals 87 and 88 is fed to a diode ring circuit 92 whose output signal is fed to the operational amplifier 93. The control signal 16 is proportional to the absolute value of the potential difference between the signal 87 and 88 and thus independent of the polarity of the potential difference. The circuit, therefore, produces the control signal 16 which corresponds to that of the amplitude of the received signal.

FIG. 28 deals with the deliberately effected (with respect to time) distortion of the receiver signal, in accordance with the invention, in the signal path of a receiver. FIG. 28 shows the transfer characteristic of a transistor amplifier which differs from the characteristic of a transistor in that a relatively linear range obtained by corresponding negative feedback is present. The distortion is effected in the embodiment of FIG. 28 by operating point displacement, more particularly, the operating point is moved during the distortion from the normal operating point A1 to the distortion operating point A2. While one operates at the operating point A1 in an area with a relatively linear characteristic range, at the operating point A2 one operates in a relatively nonlinear characteristic range in order to obtain the desired (temporary) distortions by means of the non-linear characteristic range.

What is claimed is:

1. In a radio receiver including a signal path having an input circuit and a mixer and in which a received signal containing a desired signal in a given frequency range and undesired disturbance signals is fed via said input circuit to said mixer wherein it is converted, by mixing, into an intermediate frequency signal or a baseband signal, the improvement comprising:
    distorting means for temporarily distorting the received signal in said signal path;
    a signal rectifier for receiving the converted signal;
    storing means for storing the signal which appears at the output of said rectifier during the period when the received signal is being distorted by said distorting means; and
    means connected to the output of said storing means for deriving a control signal from the stored signal and for feeding the control signal to said input circuit to attenuate said received signal to suppress the disturbance signals.

2. A radio receiver according to claim 1, wherein said means for temporarily distorting includes means for appyling a pulse signal to a component of said signal path to effect the temporary distortion.

3. A radio receiver according to claim 2 having at least one component designed to produce the desired distortion in response to said applied pulse.

4. A radio receiver according to claim 1, wherein said storing means comprises a sample and hold circuit which is controlled by a pulse signal occurring during each period when the received signal is being temporarily distorted.

5. A radio receiver according to claim 1 wherein: said input circuit includes a preamplifier connected to be supplied with the received signal; said storing means stores the output signal of said rectifier during each period when the received signal is being temporarily distorted until the next such period; and said means for deriving supplies the control signal to said preamplifier stage to attenuate the received signal.

6. A radio receiver according to claim 5, wherein the signal distortion takes place in the signal path between the input of the receiver and the output of the mixer.

7. A radio receiver according to claim 6, wherein the signal distortion is effected in at least one of the preamplifier and the mixer by correspondingly low negative signal feedback.

8. A radio receiver according to claim 6, wherein the signal distortion is effected by corresponding operating point setting of components in at least one of the preamplifier and the mixer.

9. A radio receiver according to claim 6, wherein distortion forming components which are connected to at least one of the preamplifier and the mixer are provided.

10. A radio receiver according to claim 6, wherein the signal distortion takes place in at least one of the mixer and the preamplifier.

11. A radio receiver according to claim 5 further comprising a band-pass filter connected between said preamplifier and said mixer, and a further rectifier connected to the output of one of said preamplifier and said band-pass filter; and wherein said means for deriving includes a coupling circuit which couples the signal from said further rectifier with the signal stored in said storing means, and the output signal of the coupling circuit is fed to the input stage of the receiver.

12. A radio receiver according to claim 11, wherein an adder, a multiplier, an AND circuit or the combination of an adder with a multiplier is provided as said coupling circuit.

13. A radio receiver according to claim 1, wherein the produced control signal serves to increase the preselection of the receiver.

14. A radio receiver according to claim 13 further comprising selection means in said input circuit and wherein an increase in the preselection of the receiver is effected by changing the signal transformation between signal source and selection means.

15. A radio receiver according to claim 1 wherein said input circuit is frequency tunable.

16. A radio receiver according to claim 1 wherein said input circuit includes attenuation means for producing a controllable attenuation of the received signal, a tunable received signal preselection circuit, and at least one PIN diode responsive to said control signal and connected to control at least one of said attenuation means and said preselection circuit to control the attenuation produced by said attenuation means and the tuning of said preselection circuit.

17. A radio receiver according to claim 16 further comprising means for supplying operating current to said input circuit and means connected to said means for supplying for deriving a control current for said diode from said operating current.

* * * * *